United States Patent [19]
Nguyen et al.

[11] Patent Number: 5,882,221
[45] Date of Patent: Mar. 16, 1999

[54] SOCKET FOR SEMICONDUCTOR DEVICES

[75] Inventors: Tan Nguyen, Santa Clara, Calif.; Dennis Ikola, Plymouth, Minn.

[73] Assignee: Tessera, Inc., San Jose, Calif.

[21] Appl. No.: 696,255

[22] Filed: Aug. 13, 1996

Related U.S. Application Data

[60] Provisional application No. 60/013,846 Mar. 21, 1996.

[51] Int. Cl.⁶ .................................................. H01R 13/62
[52] U.S. Cl. ............................................. 439/331; 439/71
[58] Field of Search ................................ 439/71, 73, 331

[56] References Cited

U.S. PATENT DOCUMENTS

| | | | |
|---|---|---|---|
| 4,655,519 | 4/1987 | Evans et al. | 439/74 |
| 4,818,728 | 4/1989 | Rai et al. | 29/739 |
| 5,006,792 | 4/1991 | Malhi et al. | 324/762 |
| 5,009,608 | 4/1991 | Shipe | 439/73 |
| 5,228,861 | 7/1993 | Grabbe | 439/66 |
| 5,244,404 | 9/1993 | Kishi et al. | 439/73 |
| 5,493,237 | 2/1996 | Volz et al. | 439/73 |
| 5,648,893 | 7/1997 | Loo et al. | 439/73 |
| 5,669,783 | 9/1997 | Inoue et al. | 439/331 |

OTHER PUBLICATIONS

Nolan et al., A Tab Tape–Based Bare Chip Test and Burn Carrier, 1994 ITAP and Flip Chip Proceedings, pp. 173–179.
Hill et al., Mechanical Interconnection System for Solder Bump Dice, 1994 ITAP and Flip Chip Proceedings, pp. 82–86.
Alan D. Knight, MCM to Printed Wiring Board (Second Level) Connection Technology Options, Multichip Module Technologies and Alternatives, ed. by Daryl Ann Doane and Paul D. Franzon, Van Nostrand, 1993, pp. 504–509 and pp. 521–523.

*Primary Examiner*—Steven L. Stephan
*Assistant Examiner*—T. C. Patel
*Attorney, Agent, or Firm*—Lerner, David, Littenberg, Krumholz & Mentlik

[57] ABSTRACT

A socket which compensates for non-planarities in a semiconductor device. The socket has a base with an aperture for receiving a semiconductor device and a plurality of bond pads within the aperture. The bond pads are typically electrically connected to external circuitry in some fashion. The socket also includes a lid which has a spring loaded portion for applying a force on a back surface of a semiconductor device when a major surface of the lid is in intimate contact with a major surface of the base such that contacts on the semiconductor device may make electrical contact to the bond pads while compensating for non-planarities in the semiconductor device. This compensation scheme is located in the spring loaded portion of the lid. This compensation scheme may also be aided through the use of a compliant, and perhaps compressible, interposer disposed between the semiconductor device's contacts and the bond pads.

37 Claims, 4 Drawing Sheets

SOCKET FOR SEMICONDUCTOR DEVICES

CROSS REFERENCE TO RELATED APPLICATIONS

The present application claims benefit of U.S. Provisional Application No. 60/013,846 filed Mar. 21, 1996.

FIELD OF THE INVENTION

The present invention relates to components useful for mounting semiconductor chips and related electronic components to supporting substrates for normal operation and for testing purposes.

BACKGROUND OF THE INVENTION

Modern electronic devices utilize semiconductor chips, commonly referred to as "integrated circuits" which incorporate numerous electronic elements. These chips are mounted on substrates which physically support the chips and electrically interconnect each chip with other elements of the circuit. The substrate may be a part of a discrete chip package used to hold a single chip and equipped with terminals for interconnection to external circuit elements. Such substrates may be secured to an external circuit board or chassis. Alternatively, in a so-called "hybrid circuit" one or more chips are mounted directly to a substrate forming a circuit panel arranged to interconnect the chips and the other circuit elements mounted to the substrate. In either case, the chip must be securely held on the substrate and must be provided with reliable electrical interconnection to the substrate. The interconnection between the chip itself and its supporting substrate is commonly referred to as "first level" assembly or chip interconnection, as distinguished from the interconnection between the substrate and the larger elements of the circuit, commonly referred to as a "second level" interconnection.

The structures utilized to provide the first level connection between the chip and the substrate must accommodate all of the required electrical interconnections to the chip. The number of connections to external circuit elements, commonly referred to as "input-output" or "I/O" connections, is determined by the structure and function of the chip. Advanced chips capable of performing numerous functions may require substantial numbers of I/O connections.

The size of the chip and substrate assembly is a major concern. The size of each such assembly influences the size of the overall electronic device. More compact assemblies, with smaller distances between chips provide smaller signal transmission delays and hence permit faster operation of the device.

First level interconnection structures connecting a chip to a substrate ordinarily are subject to substantial strain caused by thermal cycling as temperatures within the device change during operation. The electrical power dissipated within the chip tends to heat the chip and substrate, so that the temperatures of the chip and substrate rise each time the device is turned on and fall each time the device is turned off. As the temperatures change, the chip and substrate may expand and contract by different amounts. This causes the electrical contacts on the chip to move relative to the electrical contact pads on the substrate. This relative movement deforms the electrical interconnections between the chip and substrate and places them under mechanical stress. These stresses are applied repeatedly with repeated operation of the device, and can cause breakage of the electrical interconnections.

Moreover, despite all of the efforts made during made during manufacture of the chips, some chips will be defective. These defects often cannot be detected until the chip is operated under power in a test fixture or in an actual assembly. A single bad chip can make a larger assembly including numerous chips and other valuable components worthless, or can require painstaking procedures to extricate the bad chip from the assembly. Therefore, the chips and the mounting components used in any chip assembly system should permit testing of chips and replacement of defective chips before the chips are fused to a substrate. The cost of the chip and substrate assembly is also a major concern.

Rai et al, U.S. Pat. No. 4,818,728 discloses a first substrate such as a chip with studs or bump leads protruding outwardly and a second substrate with recesses having solder for engaging the bump leads. Malhi et al, U.S. Pat. No. 5,006,792 discloses a test socket in which a substrate has an exterior ring-like structure and numerous cantilever beams protruding inwardly from the ring-like structure. Contacts are disposed on these cantilever beams so that the same can be resiliently engaged with contacts of a chip when the chip is placed in the socket. Nolan et al, A Tab Tape-Based Bare Chip Test and Bum Carrier, 1994 ITAP And Flip Chip Proceedings, pp. 173–179 discloses another socket with cantilevered contact fingers for engaging the contacts on a chip; in this case the contact fingers are formed on a flexible tab tape and reinforced by a silicone material so as to provide forcible engagement and a wiping action with the chip contact.

Hill et al, Mechanical Interconnection System For Solder Bump Dice, 1994 ITAP And Flip Chip Proceedings PP. 82–86, discloses a test socket for flip chip devices with solder bumps. The socket has rough, dendritic structures on contact pads; here again, the chip with the solder bumps thereon is forced into the engagement with the rough, dendritic structures so as to make temporary contact for testing.

The reference "MCM to Printed Wiring Board (Second Level) Connection Technology Options" by Alan D. Knight, (in Multichip Module Technologies and Alternatives, ed. by Daryl Ann Doane and Paul D. Franzon, Van Nostrand, 1993, pp. 504–509 and pp. 521–523), together with the corresponding U.S. Patent of Evans et al, U.S. Pat. No. 4,655,519 and Grabbe, U.S. Pat. No. 5,228,861 disclose additional connection systems using deformable contacts.

Despite all of these efforts in the art however, there have still been needs for improved components for connecting semiconductor chips and other microelectronic components; for improved methods for connecting such chips and components and for improved systems which include the connected chips and components.

SUMMARY

The present invention overcomes the problems in the prior art by providing an apparatus for compliantly interconnecting contacts on a semiconductor device to socket bond pads such that the device may be electrically connected to an external circuit.

More specifically, the present invention provides a socket having a bottom portion which has a base, an alignment ring, and a socket bottom. There is a central, aligned aperture in the alignment ring and the socket bottom for receiving a semiconductor device. The base further has a plurality of bond pads within the aperture. These bond pads are typically electrically connected to external circuitry in some fashion. The bottom portion may also include a compliant interposer disposed within the aligned apertures. The interposer has a plurality of conductors disposed therewithin such that the conductors are in electrical contact with the bond pads on the base and extend to an exposed major surface of the interposer such that they may be engaged by a semiconductor device.

The socket also includes a top portion having a lid, a pressure plate and a retainer ring arranged such that the retainer ring is attached to the lid and a flanged portion of the pressure plate resides between the retainer ring and the lid while a portion of the pressure plate extends though an aperture in the retainer ring for applying force to the back surface of a semiconductor device. A spring is disposed between the lid and the pressure plate such that a compressive force acts on the pressure plate, either the spring or the pressure plate further having a raised portion which allows the pressure plate to rotate at the point of contact therebetween thus compensating for non-planarities in the semiconductor device. This compensation scheme may also be aided by making the interposer compressible such that it compresses in response to the force one the back of the semiconductor device by the pressure plate.

DESCRIPTION OF A PREFERRED EMBODIMENT

Figure 1:
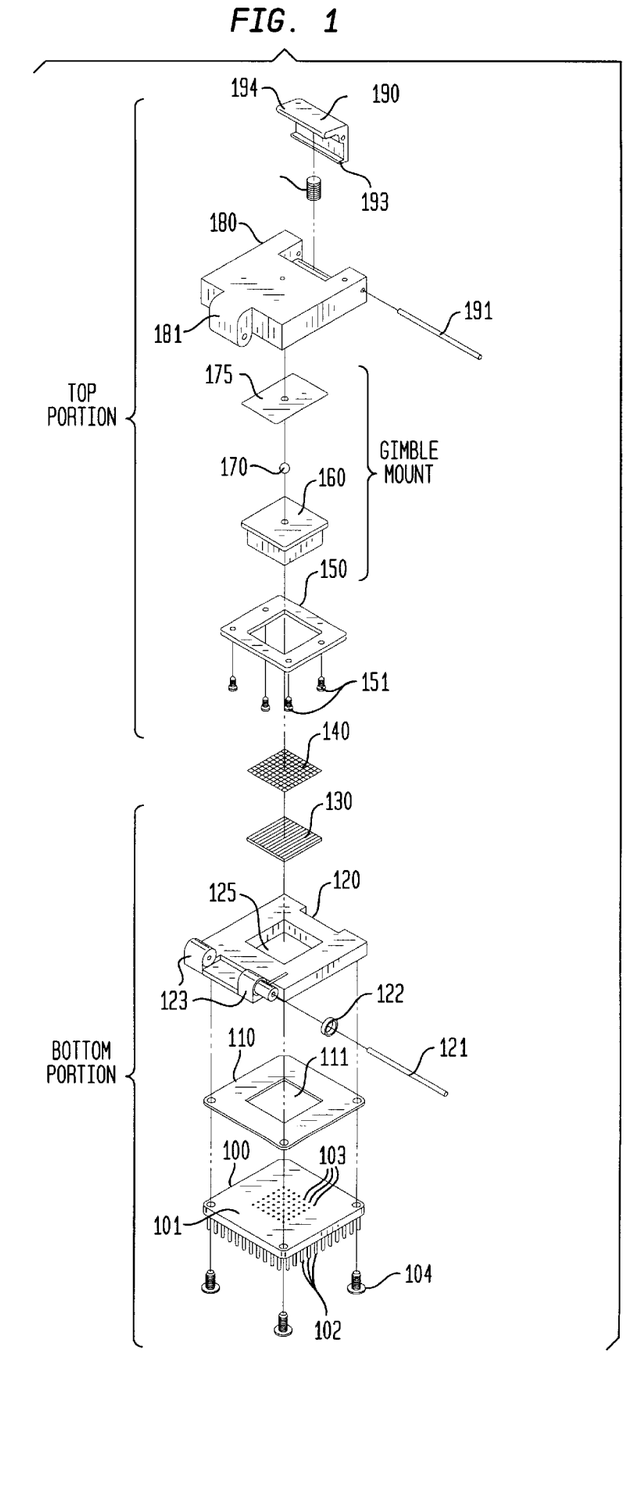
FIG. 1 shows an exploded, perspective view of the socket, according to the present invention.
Figure 2:
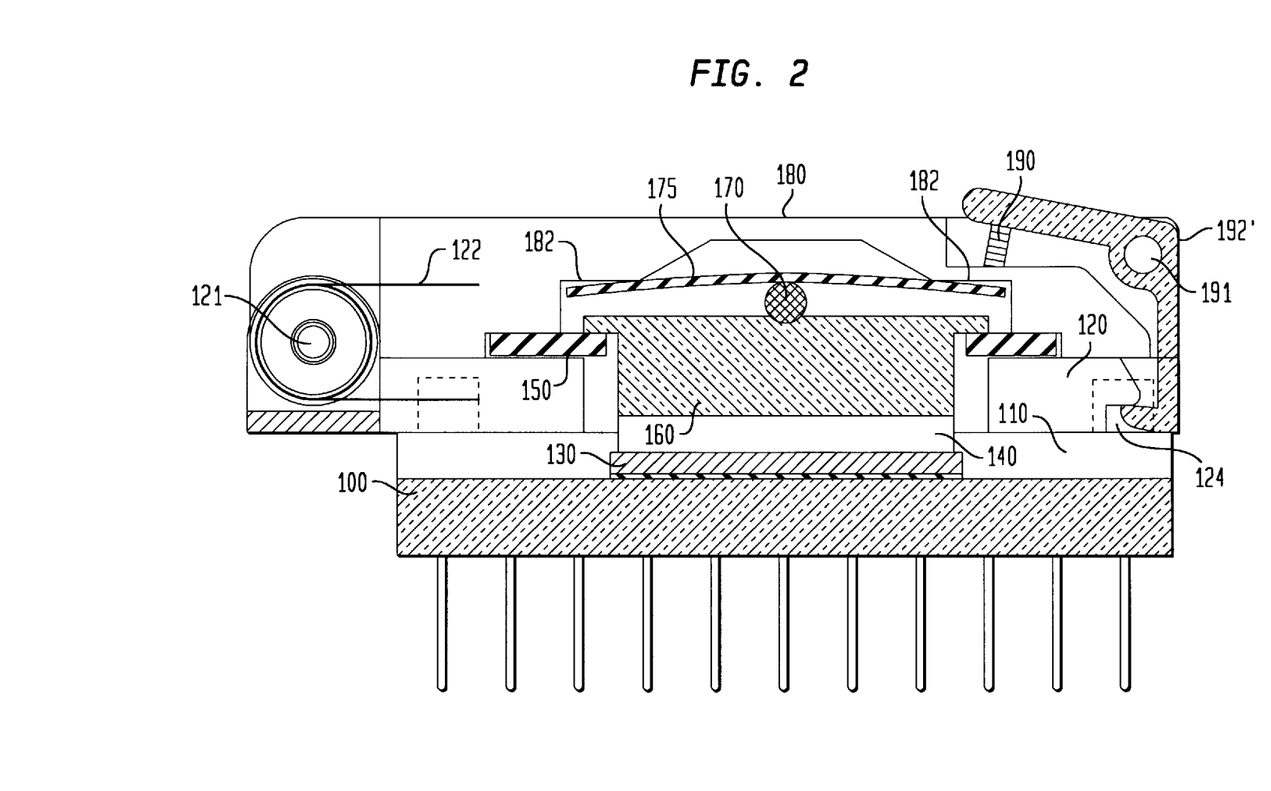
FIG. 2 shows a cross-section view of the socket, according to the present invention.

FIG. 1 is an exploded perspective view of a socket for a semiconductor chip or die, according to the present invention. FIG. 2 is a cross sectional view of the socket. The overall structure of the socket resembles a hinged, clamshell-style structure.

The socket base 100 is comprised of a rigid substrate 101, typically comprised of a material such as ceramic, which has an array of conductive pins 102 affixed to a first major surface and extending therefrom for easily plugging the socket base 100 into a conventional printed circuit board or the like. Each conductive pin 102 is electrically connected to one conductive stud 103 having an exposed surface located at a second surface of the substrate 101 and generally planar with respect to the substrate's second surface.

An alignment ring 110 is disposed on top of the second surface of the rigid substrate 101 such that a central aperture 111 encompasses the array of conductive studs 103. The dimensions of the central aperture 111 should be just slightly larger than the outer dimensions of the packaged or bare die 140 so that the die fits within the alignment ring 110 without any substantial ability to move laterally. The alignment ring 110 also helps to provide a bounding/aligning mechanism for the pressure plate 160, as described below. A compliant interposer 130 is disposed between the conductive studs 103 and the contact pads on the semiconductor device 140. The term semiconductor device as it is used herein means both packaged semiconductor devices and bare unpackaged die. Typically, the interposer 130 material is also at least nominally compressible. In one embodiment, the interposer 130 is comprised of an elastomeric material which has a plurality of conductors therewithin such that the contact pads on the semiconductor device 140 may make electrical connections to respective conductive studs 103. An example of such an interposer is manufactured by Shin-Etsu of Japan who offers the material in thicknesses between 20 and 40 mils (about 0.5 and 1.0 mm). Gold wires are embedded in the Shin-Etsu interposer along parallel axis's, so the material conducts electricity along only one axis. This axis goes through the interposer from one side to the other, however it is not quite perpendicular. The manufacturer of the material offers it with an angle of either 45° or 63° off the plane of the interposer 112. Because of the angle of the wires in the interposer 112, the position of the package 109 as defined by the package alignment ring 110 is slightly offset from the array of gold contacts on the header. The amount of offset is larger for the 45° material, so the position of the hole in the package alignment ring 111 would be different than if the 63° material were used.

A socket bottom 120 is attached to the ring/base combination (100/110) such that the alignment ring is disposed between the bottom 120 and the base 100. Typically, mounting screws 104 are the means with which the bottom is attached. The screws 104 are disposed through apertures in the base 100 and the alignment ring 110 and are threaded into apertures in the socket bottom 120. The socket bottom has central aperture 125 such that a semiconductor device 140 may be placed therein. This aperture 125 is desirably larger than the aperture in the alignment ring 111, to facilitate placement and extraction of the device 140.

The top portion of the socket is typically attached to the socket bottom 120 by a hinged means on one edge or side of the assembly. In the embodiment shown in FIG. 1, a projecting portion 181 on one edge of the lid 180 is positioned between a similar pair of projecting portions 123 on one edge of the socket bottom 120 such that a hinge pin 121 may be disposed through a central aperture in the projecting portions (123/181). The lid 180 thus rotates around the axis provided by the hinge pin 121. A torsion spring 122 provides a force on the bottom/lid assembly causing the assembly to open when the latch lock 190 is disengaged, as described below.

A retainer ring 150 secures the gimbal mount to the interior of the lid 180 with a second set of mounting screws 151. The latch lock 190 holds the lid 180 closed, as shown in FIG. 2, against the force exerted by the torsion spring 122. The latch lock 190 has limited freedom to rotate around a hinge pin 191, and compression spring 192 pushes the latch lock 190 against the end of its travel, where a tang 193 on the latch lock 190 engages a slot 124 on the socket bottom 120 when the lid 180 is closed. Typically, the tang 193 on the latch lock 190 will be slanted so as the lid 180 closes the tang 193 engages the slot 124 on the socket bottom 120 with a click action. The compression spring 192 ensures that the latch lock 190 will secure the lid 180 to the bottom 120 until a force is exerted on the top 194 of the latch lock 190 thereby compressing the spring and releasing the tang 193 from the slot 124. The compression spring may be replaced with a torsion spring, as shown in FIG. 2, among other alternatives.

As shown in FIG. 2, the interior of the lid 180 is partially hollowed such that the leaf spring may be placed against a set of ridges 182, which are typically integral with the lid 180 itself and may further embody a single ridge which encircles the interior of the lid 180. The leaf spring will typically have a small aperture (not shown) in which the ball bearing 170 is seated. This aperture performs the function of bounding the ball bearing 170 when the assembly is under normal conditions and pressure is being placed upon the ball bearing 170 by the pressure plate 160.

Figure 3A:
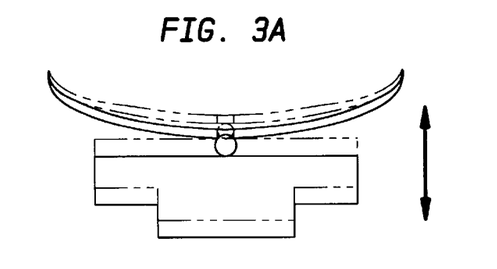
FIGS. 3A and 3B show the spring, gimbal and pressure plate elements, according to the present invention.
Figure 3B:
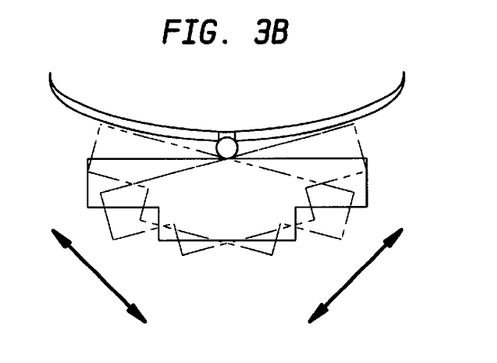

When the lid 180 is in the open position, constant pressure is placed upon the pressure plate 160 by the spring 175. This pressure is translated through the bail bearing 170 causing the edges of the pressure plate 160 to evenly rest upon the retainer ring 150. In the closed position after a semiconductor device 140 has been placed within the bottom portion of the socket, shown in FIG. 2, the added thickness of the semiconductor device 140 within the confined area of the socket increases the amount of compressive force the spring 175 places on the back of the semiconductor device 140. This compressive action is shown in FIG. 3A. FIG. 3B graphically shows the self leveling aspects of the present invention in that the ball bearing 170 allows the pressure plate 160 to compensate for non-planarities in the semiconductor device 140 or the interposer 130 within the bounds of the retainer ring 150 such that the contacts on the device 140 may make good electrical contact with the conductors within the interposer 130. Because of the allowed movement of the pressure plate 160 with respect to the ball bearing 170, the pressure plate 160 is allowed to seek its own orientation without regard to the orientation of the lid 180.

While the interposer 130 is compliant and may also be compressible, it may not provide enough compliancy/compression to accommodate the force placed on the back of the semiconductor device 140. Such forces can be great enough to crack or otherwise compromise the device 140. Thus, the aperture 111 in the alignment ring 110 is manufactured such that it is at least slightly smaller than the device bearing surface of the pressure plate 160. In operation, the device bearing surface of the pressure plate 160 will abut against the alignment ring 110 thus regulating the maximum pressure which may be placed on the semiconductor device 140 by selecting the appropriate thickness for the alignment ring given the thickness of the combination of a particular device 140 and interposer 130 and the desired force thereon. Typically, the thickness of an alignment ring 110 is the sum of the thicknesses of the semiconductor device 140, the height of any raised portions on the device contacts, such as the plated or deposited conductors (plated bumps, solder balls, etc.), and the thickness of the interposer 130, minus approximately 2% to 25% of the interposer thickness depending on the compressibility of the interposer material being used.

Figure 4A:
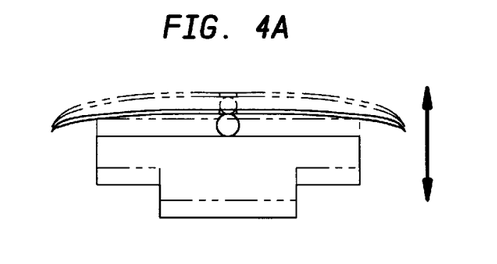
FIGS. 4A and 4B show an alternate arrangement of the spring, gimbal and pressure plate elements, according to the present invention.
Figure 4B:
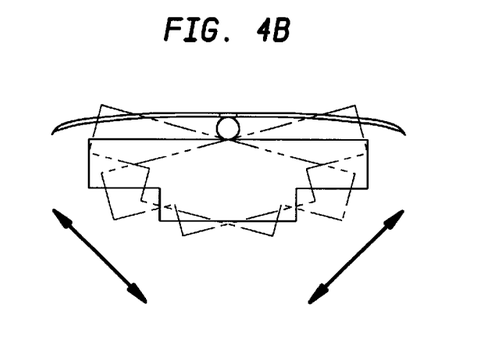

An alternative leaf spring configuration is shown in FIGS. 4A and 4B. Many other spring designs are possible. Further, other mechanisms may be used for the gimbaled, self-leveling pressure plate assembly. For example, a ball end or cone shaped contact could be machined into the top of the pressure plate 160 or stamped into the bottom of the leaf spring 175. Further, cylindrical surface could be stamped into the spring and machined into the pressure plate such that a single point of connection results when the surfaces are crossed (i.e. are roughly perpendicular to each other).

Figure 5:
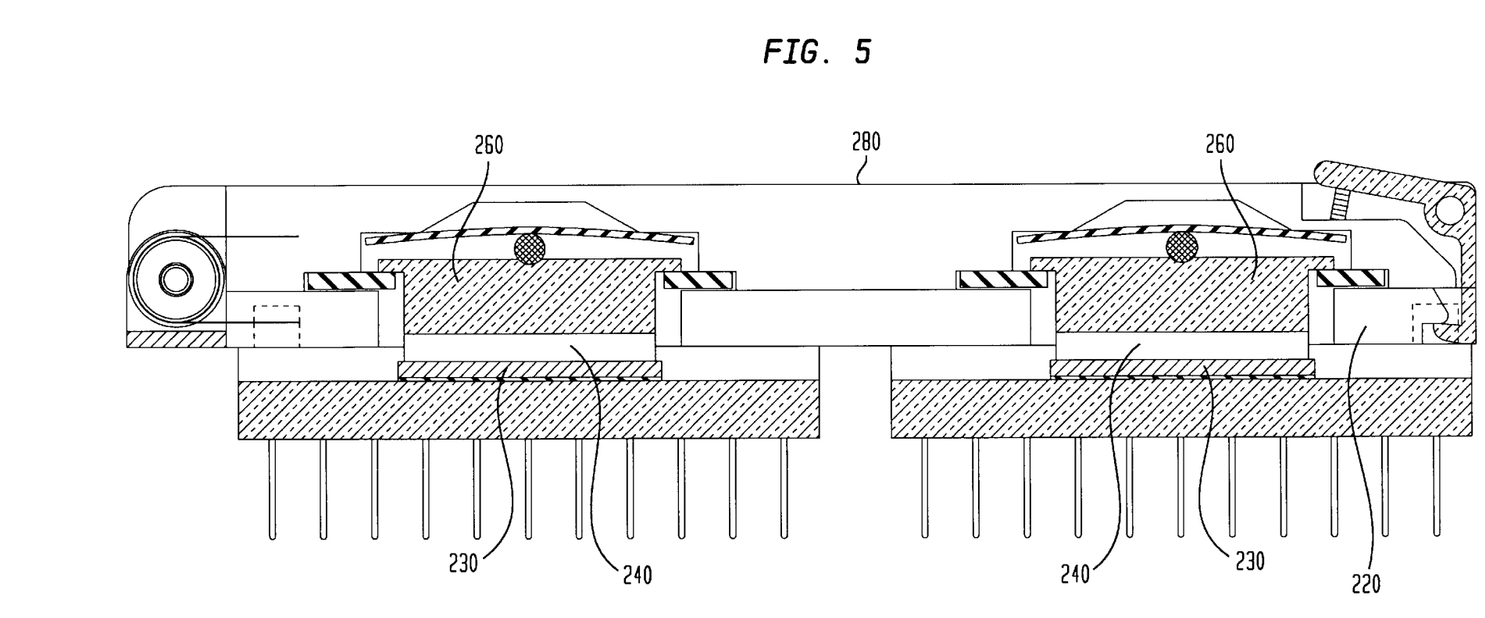
FIG. 5 shows a cross-sectional side view of a socket according to another preferred embodiment of the present invention.

In one alternative embodiment, as shown in FIG. 5 a plurality of the above described sockets are provided in a grid-like array. In this embodiment, a plurality of apertures are provided in a first rigid substrate 220 each for receiving a semiconductor device 240. As described above, a plurality of bond pads are positioned at the bottom surface of each of the apertures and are electrically connected to either test equipment or other circuit elements, so that electrical connections may be made between respective chip contacts and substrate bond pads. Typically, a compliant, and perhaps compressible, pad 230 is disposed between the bond pads and the chip contacts. The compliant pads 230 having conductive means, as described above, for making such electrical connection between the chip contacts and the bond pads. In this configuration, a standard pick and place machine, such as an Anarad manufactured by Anarad, Inc. in Happauge, N.Y., may be used to place each semiconductor device in a respective aperture. A single lid unit 280 having a plurality of the aforementioned spring loaded pressure plates 260 may then be secured to the bottom substrate 220 such that the pressure plates 260 are positioned each juxtaposed with a respective aperture in the bottom substrate 220. Many devices 240 can thereby be tested simultaneously. The good, operational devices 240 may then be used and the bad, non-operational or defective devices 240 may be discarded or reworked.

Having fully described several embodiments of the present invention, it will be apparent to those of ordinary skill in the art that numerous alternatives and equivalents exist which do not depart from the invention set forth above. It is therefore to be understood that the present invention is not to be limited by the foregoing description, but only by the appended claims.

What is claimed is:

1. A socket for a semiconductor device, comprising:
   a bottom portion having a base, an alignment ring, a socket bottom and a compliant interposer, wherein the interposer is disposed within aligned central apertures of the alignment ring and said socket bottom and has a plurality of conductors disposed therewithin such that the conductors are in electrical contact with conductors on a surface of the base and extend to an exposed major surface of the interposer;
   a top portion having a lid, a pressure plate and a retainer ring arranged such that the retainer ring is attached to the lid such that a portion of the pressure plate resides between the retainer ring and the lid while a portion of the pressure plate extends though an aperture in the retainer ring for applying force to the back surface of a semiconductor device; and
   a spring disposed between the lid and the pressure plate such that a compressive force acts on the pressure plate, either the spring or the pressure plate further having a raised portion which allows the pressure plate to rotate at the point of contact therebetween.

2. A socket as claimed in claim 1, wherein the interposer is compressible, whereby a semiconductor device may bear down on the exposed surface of the interposer due to the application of the compressive force.

3. A socket as claimed in claim 2, wherein a thickness dimension of the alignment ring governs the maximum compression of the interposer.

4. A socket as claimed in claim 3, wherein the interposer may be compressed between 2 percent and 30 percent of its thickness.

5. A socket as claimed in claim 4, wherein the aperture in the alignment ring is smaller than the pressure plate whereby the pressure plate bears on the alignment ring at a selected compressed thickness of the interposer.

6. A socket as claimed in claim 1, wherein the raised portion is a ball bearing disposed between the spring and the pressure plate.

7. A socket as claimed in claim 1, wherein the raised portion is stamped into the spring.

8. A socket as claimed in claim 1, wherein the raised portion is machined into the pressure plate.

9. A socket for a semiconductor device, comprising:

a base having conductors on a first surface thereof;

an alignment ring having a central aperture extending from a first surface to a second surface, wherein the first surface of the alignment ring abuts the first surface of the base such that the conductors thereon fall within the aperture in the alignment ring;

a compressible interposer having a first surface, a second surface and a plurality of conductors disposed therewithin and extending from the first to the second surface, the compliant interposer being disposed within the central aperture of the alignment ring such that the conductors of the interposer are in electrical contact with conductors on a surface of the base;

a socket bottom having a central aperture which is roughly aligned with the aperture in the alignment ring;

a lid having a first surface, the lid being attached to the socket bottom at a hinged side;

a retainer ring having a central aperture extending between a first surface and a second surface, wherein the second surface of the retainer ring is connected to the first surface of the lid;

a pressure plate disposed such that a flange portion resides and is constrained between the retainer ring and the lid, the pressure plate further having a second portion extending through the aperture in the retainer ring;

a spring disposed between the lid and the pressure plate such that a compressive force acts on the pressure plate, either the spring or the pressure plate having a raised portion which allows the pressure plate to rotate at the point of contact therebetween.

10. A socket as claimed in claim 9, wherein a thickness dimension of the alignment ring governs the maximum compression of the interposer.

11. A socket as claimed in claim 10, wherein the aperture in the alignment ring is smaller than the pressure plate whereby the pressure plate bears on the alignment ring at a selected compressed thickness of the interposer.

12. A socket as claimed in claim 11, wherein the interposer may be compressed between about 2 percent and 30 percent of its thickness.

13. A socket as claimed in claim 9, wherein the raised portion is a ball bearing disposed between the spring and the pressure plate.

14. A socket as claimed in claim 9, wherein the raised portion is stamped into the spring.

15. A socket as claimed in claim 9, wherein the raised portion is machined into the pressure plate.

16. An apparatus for interconnecting contacts on a semiconductor device to bond pads, comprising:

a base having an aperture adapted to receive a semiconductor device having a body and having contacts and a plurality of bond pads within the aperture; and a lid having a spring loaded portion adapted to apply a force on a back surface of the body of the semiconductor device when a major surface of the lid is juxtaposed with a major surface of the base whereby contacts on the semiconductor device make electrical contact to the bond pads, wherein the spring loaded portion has a raised portion which allows the spring loaded portion to rotate in response to a non-planar semiconductor device.

17. An apparatus as claimed in claim 16, wherein a compliant interposer is disposed in the aperture of the base, the interposer having a plurality of conductors therein for electrically connecting the contacts on a semiconductor device to the bond pads.

18. An apparatus as claimed in claim 17, wherein the interposer is compressible.

19. An apparatus as claimed in claim 18, wherein the depth of the aperture in the base regulates the maximum compression of the interposer.

20. An apparatus as claimed in claim 19, wherein the interposer may be compressed between about 2 percent and 30 percent of its thickness.

21. An apparatus as claimed in claim 20, wherein the aperture in the base is smaller than the spring loaded portion.

22. An apparatus as claimed in claim 16, wherein the spring loaded portion is comprised of a leaf spring which bears against a pressure plate.

23. An apparatus as claimed in claim 16, wherein the raised portion is a ball bearing disposed between the spring and the pressure plate.

24. An apparatus as claimed in claim 22, wherein the spring loaded portion includes a spring and said raised portion is connected to the spring.

25. An apparatus as claimed in claim 22, wherein the raised portion is connected to the pressure plate.

26. An apparatus for interconnecting contacts on a plurality of semiconductor devices to respective bond pads on a bottom substrate comprising:

a bottom substrate having a plurality of apertures, each aperture adapted to receive a respective semiconductor device having a body and having contacts and a plurality of bond pads within each aperture; and a lid unit having a plurality of spring loaded portions each juxtaposed with a respective aperture in the bottom substrate, wherein the spring loaded portions are adapted to apply a force on a back surface of the body of each semiconductor device when a major surface of the lid is juxtaposed with a major surface of the bottom substrate, whereby contacts on each semiconductor device make electrical contact to the respective bond pads, wherein each spring loaded portion has a raised portion which allows each spring loaded portion to rotate independently of the lid unit and the other spring loaded portions in response to a non-planar semiconductor device.

27. An apparatus as claimed in claim 26, wherein a compliant interposer is disposed in each of the apertures in the bottom substrate, the interposers each having a plurality of conductors therein for electrically connecting the contacts on a semiconductor device to the bond pads.

28. An apparatus as claimed in claim 27, wherein the interposer is compressible.

29. An apparatus as claimed in claim 28, wherein the depth of each aperture in the bottom substrate regulates the maximum compression of the respective interposer.

30. An apparatus as claimed in claim 29, wherein each interposer may be compressed between about 2 percent and 30 percent of its thickness.

31. An apparatus as claimed in claim 30, wherein each aperture in the base is smaller than the respective juxtaposed spring loaded portion.

32. An apparatus as claimed in claim 26, wherein each spring loaded portion is comprised of a leaf spring which bears-against a pressure plate.

33. An apparatus as claimed in claim 32, wherein the raised portion is a ball bearing disposed between the respective springs and the pressure plates.

34. An apparatus as claimed in claim 32, wherein each said raised portion is connected to one of the respective springs.

35. An apparatus as claimed in claim 32, wherein each said raised portion is connected to one of the respective pressure plates.

36. An apparatus for interconnecting contacts on a semiconductor chip to bond pads comprising:

a base having an aperture adapted to receive a semiconductor chip having a back surface and contacts on a front face thereof and a plurality of bond pads within the aperture; and a lid having a spring loaded portion adapted to apply a force on the back surface of a semiconductor chip when a major surface of the lid is juxtaposed with a major surface of the base, whereby the contacts on the front face of the semiconductor chip make electrical contact to the bond pads, wherein the spring loaded portion has a raised portion which allows the spring loaded portion to rotate in response to a non-planar semiconductor chip.

37. An apparatus for interconnecting contacts on a plurality of semiconductor chips to respective bond pads on a bottom substrate comprising:

a bottom substrate having a plurality of apertures each said aperture adapted to receive a respective semiconductor chip having a back surface and contacts on a front face thereof and a plurality of bond pads within each aperture; and a lid unit having a plurality of spring loaded portions each juxtaposed with a respective aperture in the bottom substrate, wherein the spring loaded portions are adapted to apply a force on the back surface of each semiconductor chip when a major surface of the lid is juxtaposed with a major surface of the bottom substrate, whereby the contacts on the front face of each semiconductor chip make electrical contact to the respective bond pads, wherein each spring loaded portion has a raised portion which allows each spring loaded portion to rotate independently of the lid unit and the other spring loaded portions in response to a non-planar semiconductor chip.

* * * * *

UNITED STATES PATENT AND TRADEMARK OFFICE
CERTIFICATE OF CORRECTION

PATENT NO. : 5,882,221
DATED : March 16, 1999
INVENTOR(S) : Nguyen et al.

It is certified that error appears in the above-identified patent and that said Letters Patent is hereby corrected as shown below:

Column 2, line 23, "Bum" should read --Burn--.

Column 5, line 8, "bail" should read --ball--.

Column 8, line 15, after "the" insert --spring loaded portion includes a spring and said--.

Column 8, line 19, delete "spring loaded portion includes a spring and said".

Column 8, line 61, "bears-against" should read --bears against--.

Signed and Sealed this

Fourteenth Day of September, 1999

Attest:

Q. TODD DICKINSON

*Attesting Officer*          *Acting Commissioner of Patents and Trademarks*